United States Patent
Ries et al.

(10) Patent No.: US 9,333,525 B2
(45) Date of Patent: May 10, 2016

(54) SUBSTRATE SPREADING DEVICE FOR VACUUM PROCESSING APPARATUS, VACUUM PROCESSING APPARATUS WITH SUBSTRATE SPREADING DEVICE AND METHOD FOR OPERATING SAME

(71) Applicant: Applied Materials, Inc., Santa Clara, CA (US)

(72) Inventors: Florian Ries, Westerngrund (DE); Andreas Sauer, Großostheim (DE); Stefan Hein, Blackenbach (DE)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/160,121

(22) Filed: Jan. 21, 2014

(65) Prior Publication Data

US 2015/0158048 A1    Jun. 11, 2015

(30) Foreign Application Priority Data

Dec. 10, 2013  (EP) .................................. 13196505

(51) Int. Cl.

| | | |
|---|---|---|
| C23C 14/56 | (2006.01) | |
| C23C 16/46 | (2006.01) | |
| C23C 16/54 | (2006.01) | |
| B05C 9/14 | (2006.01) | |
| B05C 13/00 | (2006.01) | |
| B05C 9/08 | (2006.01) | |
| B05C 1/08 | (2006.01) | |

(Continued)

(52) U.S. Cl.
CPC ................. *B05C 9/08* (2013.01); *B05C 1/0826* (2013.01); *B05C 1/12* (2013.01); *B05C 9/14* (2013.01); *B05C 13/00* (2013.01); *B05C 15/00* (2013.01); *B05D 3/12* (2013.01); *C23C 14/50* (2013.01); *C23C 14/562* (2013.01); *C23C 16/0209* (2013.01); *C23C 16/458* (2013.01); *C23C 16/46* (2013.01); *C23C 16/481* (2013.01); *C23C 16/545* (2013.01); *H01J 37/3277* (2013.01); *B65G 23/34* (2013.01); *G11B 5/85* (2013.01)

(58) Field of Classification Search
None
See application file for complete search history.

(56) References Cited

U.S. PATENT DOCUMENTS 2,405,662 A * 8/1946 McManus et al. ............ 118/718
2,812,270 A * 11/1957 Alexander ..................... 118/718

(Continued)

FOREIGN PATENT DOCUMENTS

| WO | 2011/049567 A1 | 4/2011 |
| WO | 2013/115125 A1 | 8/2013 |

OTHER PUBLICATIONS

European Patent Office; extended European Search Report for Application No. 13196505.5-1353 dated Jun. 5, 2014; 7 total pages.
PCT Notification of Transmittal of the International Search Report and the Written Opinion of the International Searching Authority for International Application No. PCT/EP2014/077062 dated Feb. 10, 2015; 11 total pages.

*Primary Examiner* — Binu Thomas
(74) *Attorney, Agent, or Firm* — Patterson & Sheridan, LLP

(57) ABSTRACT

A processing apparatus for processing a flexible substrate, particularly a vacuum processing apparatus for processing a flexible substrate, is described. The processing apparatus includes a vacuum chamber; a processing drum within the vacuum chamber, wherein the processing drum is configured to rotate around an axis extending in a first direction; and a heating device adjacent to the processing drum, wherein the heating device is configured for spreading the substrate in the first direction or for maintaining a spread of the substrate in the first direction, and wherein the heating device has a dimension in a direction parallel to a substrate transport direction of at least 20 mm.

16 Claims, 5 Drawing Sheets

(51) Int. Cl.
    *B05C 1/12*     (2006.01)
    *B05C 15/00*     (2006.01)
    *B05D 3/12*     (2006.01)
    *C23C 16/02*     (2006.01)
    *C23C 14/50*     (2006.01)
    *C23C 16/458*     (2006.01)
    *C23C 16/48*     (2006.01)
    *H01J 37/32*     (2006.01)
    *B65G 23/34*     (2006.01)
    *G11B 5/85*     (2006.01)

(56) References Cited

U.S. PATENT DOCUMENTS

| | | | |
|---|---|---|---|
| 5,140,938 A * | 8/1992 | Kasanuki et al. | 118/718 |
| 6,044,792 A | 4/2000 | Ogawa et al. | |
| 2006/0192964 A1* | 8/2006 | Lotz et al. | 356/429 |
| 2009/0047114 A1* | 2/2009 | Yokoyama et al. | 414/806 |
| 2010/0196591 A1* | 8/2010 | Hein et al. | 118/500 |
| 2012/0247389 A1* | 10/2012 | Yoshida et al. | 118/719 |
| 2014/0290861 A1* | 10/2014 | Dieguez-Campo et al. | 156/345.31 |

\* cited by examiner

SUBSTRATE SPREADING DEVICE FOR VACUUM PROCESSING APPARATUS, VACUUM PROCESSING APPARATUS WITH SUBSTRATE SPREADING DEVICE AND METHOD FOR OPERATING SAME

TECHNICAL FIELD

Embodiments of the present invention relate to a vacuum processing apparatus with a heating device. Embodiments of the present invention particularly relate to a vacuum processing apparatus for processing flexible substrates. Embodiments of the present invention further relate to a method for operating a vacuum processing apparatus for coating a flexible substrate. Specifically, the relate to a processing apparatus and a method of operating a vacuum processing apparatus are provided

BACKGROUND

Processing of flexible substrates, such as plastic films or foils, is in high demand in the packaging industry, semiconductor industries and other industries. Processing may consist of coating of a flexible substrate with a desired material, such as a metal, in particular aluminum, semiconductor and dielectric materials, of etching and of other processing steps conducted on a substrate for the desired applications. Systems performing this task generally include a processing drum, e.g., a cylindrical roller, coupled to a processing system for transporting the substrate, and on which at least a portion of the substrate is processed. Further roller devices may help to guide and direct the substrate to be coated in the deposition chamber.

Generally, an evaporation process, for instance a thermal evaporation process, can be utilized for depositing thin layers of metals which can be metallized onto flexible substrates. Roll-to-Roll deposition systems are also experiencing a strong increase in demand in the display industry and the photovoltaic (PV) industry. For example, touch panel elements, flexible displays, and flexible PV modules result in an increasing demand for depositing suitable layers in Roll-to-Roll coaters, particularly with low manufacturing costs.

Flexible substrates can be processes with a plurality of processes, such as PVD, CVD, such as PECVD, etching, thermal processing or the like. Particularly for manufacturing more sophisticated electronics, optoelectronics or other devices, contacting of the surface, which is to be processed or has been processed needs to be avoided. Yet further, the requirements of the processing, e.g. deposition, show increasing demands with respect to uniformity, precision and the like, particularly for thin films. Thereby, the substrate needs to transported and wound wrinkle-free.

In view of the above, it is an object of the present invention to provide a vacuum deposition apparatus for a flexible substrate and a method for operating a vacuum deposition apparatus that overcomes at least some of the problems in the art.

SUMMARY

In light of the above, an improved processing apparatus and an improved method of operating a vacuum processing apparatus are provided.

According to one embodiment, a processing apparatus for processing a flexible substrate, particularly a vacuum processing apparatus for processing a flexible substrate, is provided. The processing apparatus includes a vacuum chamber; a processing drum within the vacuum chamber, wherein the processing drum is configured to rotate around an axis extending in a first direction; and a heating device adjacent to the processing drum, wherein the heating device is configured for spreading the substrate in the first direction or for maintaining a spread of the substrate in the first direction, and wherein the heating device has a dimension in a direction parallel to a substrate transport direction of at least 20 mm.

According to another embodiment, a processing apparatus for processing a flexible substrate, particularly a vacuum processing apparatus for processing a flexible substrate, is provided. The processing apparatus includes a vacuum chamber; a processing drum within the vacuum chamber, wherein the processing drum is configured to rotate around an axis extending in a first direction; and a heating device adjacent to the processing drum, wherein the heating device is configured for spreading the substrate in the first direction or for maintaining a spread of the substrate in the first direction, and wherein the heating device has a dimension in a direction parallel to a substrate transport direction of at least 20 mm.

According to a further embodiment, a method of operating a vacuum processing apparatus for processing a flexible substrate having a processing drum within a vacuum chamber, wherein the processing drum is configured to rotate around an axis extending in a first direction is provided. The method includes spreading the flexible substrate in the first direction or maintaining a spread of the flexible substrate in the first direction with a heating device position adjacent to the processing drum.

Embodiments are also directed at apparatuses for carrying out the disclosed methods and include apparatus parts for performing each described method step. These method steps may be performed by way of hardware components, a computer programmed by appropriate software, by any combination of the two or in any other manner. Furthermore, embodiments according to the invention are also directed at methods by which the described apparatus operates. It includes method steps for carrying out every function of the apparatus.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following.

DETAILED DESCRIPTION OF EMBODIMENTS

Figure 1:
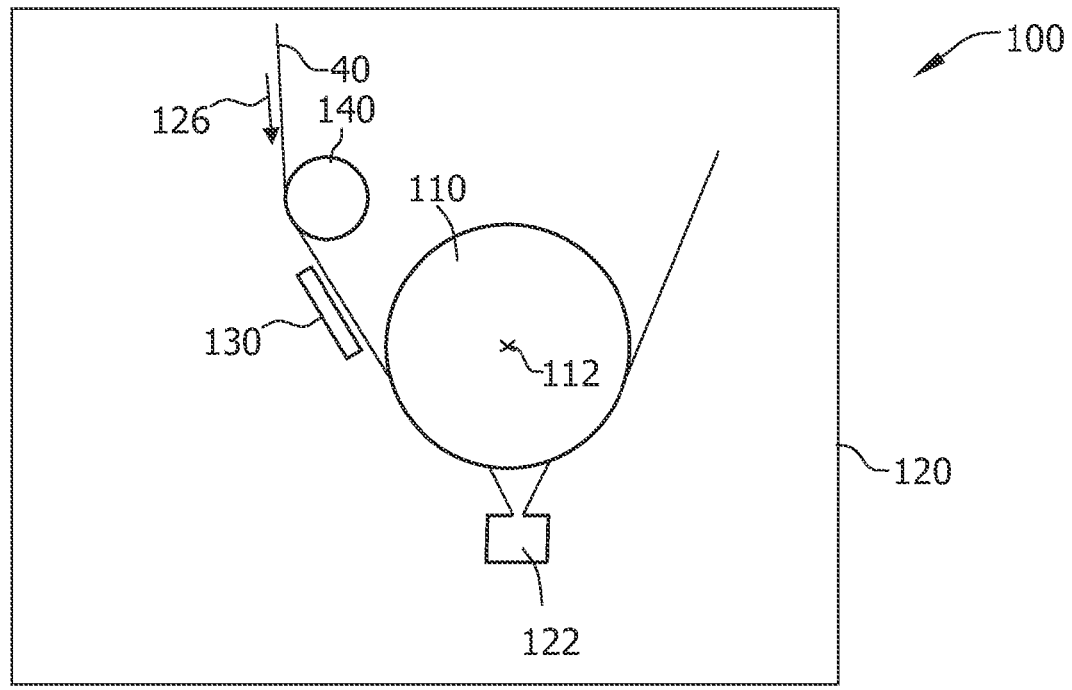
FIG. 1 shows a schematic view of a deposition apparatus according to embodiments described herein.

Reference will now be made in detail to the various embodiments of the invention, one or more examples of which are illustrated in the figures. Within the following description of the drawings, the same reference numbers refer to same components. Generally, only the differences with respect to individual embodiments are described. Each example is provided by way of explanation of the invention and is not meant as a limitation of the invention. Further, features illustrated or described as part of one embodiment can be used on or in conjunction with other embodiments to yield yet a further embodiment. It is intended that the description includes such modifications and variations.

Furthermore, in the following description, a roller device may be understood as a device, which provides a surface, with which a substrate (or a part of a substrate) may be in contact during the presence of the substrate in a deposition arrangement (such as a deposition apparatus or deposition chamber). At least a part of the roller device may include a circular-like shape for contacting the substrate. In some embodiments, the roller device may have a substantially cylindrical shape. The substantially cylindrical shape may be formed about a straight longitudinal axis or may be formed about a bent longitudinal axis. According to some embodiments, the roller device as described herein may be adapted for being in contact with a flexible substrate. The roller device as referred to herein may be a guiding roller adapted to guide a substrate while the substrate is coated (or a portion of the substrate is coated) or while the substrate is present in a deposition apparatus; a spreader roller adapted for providing a defined tension for the substrate to be coated; a deflecting roller for deflecting the substrate according to a defined travelling path; a processing roller for supporting the substrate during deposition, such as a coating roller or a processing drum; an adjusting roller or the like.

An electrical heating device as described herein should be understood as a heating device for heating the flexible substrate. According to embodiments described herein, the electrical heating device is a contactless heating device. The contactless heating device may be able to heat the substrate to a defined temperature without making contact with the substrate.

Embodiments described herein, provide a vacuum processing apparatus for flexible substrates, wherein an arrangement of rollers guides the flexible substrate from an unwinder to a re-winder through at least one processing region without contacting the front surface of the flexible substrate, i.e. contacting the back surface only. Thereby, according to embodiments described herein, which can be combined with other embodiments described herein, the front surface is the surface to be processed, e.g. coated, in the processing region. Typically, the processing region is provided by a processing roller or a processing drum. According to some embodiments, the wrinkle free substrate winding and/or transport (or a substrate winding and/or transport with a reduced wrinkle generation) can be provided by a spreader roller and a thermal support of the spreading without front surface contact of the flexible substrate. For example, a heating device, such as a contactless heating device, is provided adjacent to the processing drum, e.g. between the spreader roller and the processing roller (processing drum). According to other embodiments, which can be combined with embodiments described herein, the heating device can be provided for the substrate spreading, i.e. the spreader roller may also be omitted and the substrate spreading is conducted by the heating device, i.e. a thermal heater without front surface contact. Typically, a substrate transport arrangement includes one or more rollers, wherein the substrate transport arrangement guides the flexible substrate from a un-winding roller to a re-winding roller. For example, the heating device is positioned between the processing drum and a spreader roller of the one or more rollers, wherein the spreader roller is the first roller of the one or more rollers to touch the substrate upstream or downstream of the processing drum. According to yet further embodiments, the substrate transport arrangement includes at least one roller selected from the group consisting of: a guiding roller, a spreader device, a deflecting device, an adjusting roller.

According to embodiments, which can be combined with other embodiments described herein, the heating device has a dimension in a direction parallel to a substrate transport direction of at least 20 mm, for example 30 mm or longer. Thereby, the direction is in parallel to the substrate transport direction of a substrate portion facing the heating device. For example, for a flat heating device surface opposing the substrate, the heating device surface can be essentially parallel to the substrate portion opposing the heating device surface. However, the heating device surface is not necessarily flat or parallel. Accordingly, according to embodiments described herein, the dimension of the heating device in direction of the substrate transport direction of the substrate portion being irradiated by the heating device is at least 20 mm.

FIG. 1 is a schematic view of a processing apparatus 100 according to embodiments described herein. For example, the processing apparatus can be a deposition apparatus. The terms "coating" and "deposition" are used synonymously herein. The processing apparatus 100 may be adapted for processing a flexible substrate 40, such as, but not limited to, a web, a plastic film, or a foil.

A substrate as described herein may include materials like PET, HC-PET, PE, PI, PU, TaC, one or more metals, paper, combinations thereof, and already coated substrates like Hard Coated PET (e.g. HC-PET, HC-TAC) and the like.

The processing apparatus 100, which is exemplarily shown in FIG. 1, includes a vacuum chamber 120. According to embodiments, processing of the flexible substrate is performed within vacuum chamber 120. In particular, a processing drum 110 may be disposed in the vacuum chamber 120. Thereby, processing may be performed under vacuum conditions. For example, the vacuum chamber 120 may include a vacuum generating system (not shown), e.g. a vacuum pump, for providing the desired vacuum conditions within the vacuum chamber.

According to embodiments herein, the processing apparatus 100 includes a first roller 140 adapted for transporting and/or stretching flexible substrate 40. In one embodiment, the first roller 140 is configured, e.g., disposed relative to processing drum 106, in a manner such that the flexible substrate 40 is stretched (i.e., stretched along the substrate width). Which can be combined with other embodiments described herein, the flexible substrate 40 is stretched in a direction parallel to the rotation axis 112 of the processing drum 110. According to embodiments described herein, a roller 140, which stretches or spreads the substrate along the width or in a direction parallel to the rotation axis 112, is referred to as the spreader roller (German: "Breitstreckwalze"). Thereby, various types of spreader rollers can be provided, such as a bowed roller, a metal expandable roller, a curved bar roller, a grooved roller, or the like, some of which are explained in more detail with respect to FIGS. 2A and 2B. Thereby, an appropriate transport of flexible substrate 40 onto processing drum 106 in direction 126 may be obtained and the formation of wrinkles in the flexible substrate 40 may be reduced upon being received by processing drum 110.

According to embodiments herein, the processing drum 110 is rotatable with respect to a longitudinal axis 112 thereof. Thereby, the flexible substrate 40 may be transported and processed by being moved over the rotating processing drum 110. According to typical embodiments, the processing of flexible substrate 40 is effected, for example, but not limited thereto, by performing coating, plating, or a laminating process on a portion of flexible substrate 40, which is positioned onto the processing drum 110. For example, a source of deposition material 122 is provided in the embodiment shown in FIG. 1.

The vacuum chamber 120 may be provided with an entrance adapted for facilitating the introduction of substrate 40 into the chamber while a vacuum condition is maintained therein. Alternatively, the roller system of the deposition apparatus, including unwinding and winding rollers (not shown in FIG. 1), may be contained in vacuum chamber 120.

According to some embodiments, as exemplarily shown in FIG. 1, a heating device 130 is provided. The heating device is provided adjacent to the processing drum 110. Yet further, the heating device can be provided between the first roller 140 and the processing drum 110. The heating device 130 is configured to provide heat to the flexible substrate 40 in order to avoid that the spread introduced by the spreader roller is lost, i.e. the spread substrate is heated by the heating device 130 such that the substrate does not shrink in its initial width on the path from the first roller 140 to the processing from 110. For example, the heating device has a dimension in a direction parallel to a substrate transport direction of at least 20 mm, for example 30 mm or longer. Thereby, the substrate transport direction relates to the substrate portion irradiated by the heating device.

Figure 5:
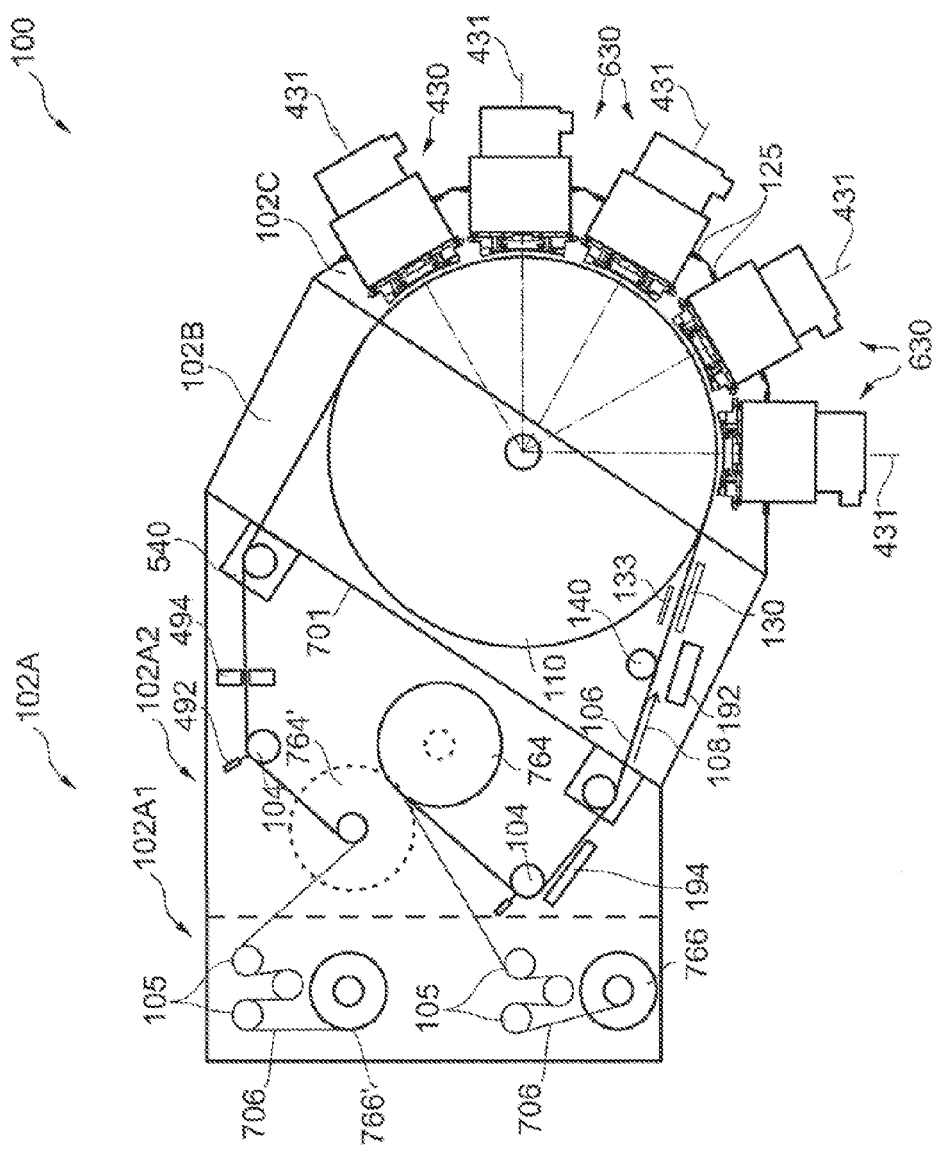
FIG. 5 shows a schematic view of a deposition apparatus according to embodiments described herein.

According to some embodiments, as exemplarily shown in FIG. 5, the heating device 130 can also be configured to provide a spread to the substrate by heating thereof. Accordingly, it is possible to reduce wrinkles in the substrate by the heating device 130, which is positioned adjacent to the processing from 110. Thereby, the heating device 130 is located, for example, between the processing from 110 and the first roller 140. According to yet further additional or alternative implementations, the distance of the heating device to the processing drum is 20 cm or below, particularly 10 cm or below. According to yet further embodiments, which can be combined with other embodiments described herein, the distance along a transport path of the flexible substrate from the first roller to the processing drum can be 110 m or below, particularly 50 cm or below.

As shown in FIG. 1, according to some embodiments, the heating device 130 is located adjacent to the processing drum 110 and along the transportation paths 126 of the flexible substrate 40 between the first roller, e.g. a spreader roller, and the processing drum 110. FIG. 1 only shows a schematic roller, e.g. in the form of a straight roller device such as a guiding roller. Yet, the first roller can also be a spreader roller, such as a spreader roller having a curved surface along the length direction of the roller. The curved surface of a spreader roller has a tensioning effect in the width direction of the substrate.

It is beneficial to provide the processing apparatus 100, wherein a roller or drum is not in contact with a front surface of the flexible substrate i.e. the surface of the substrate which is processed or coated. Further, particularly for thin substrates, for example a substrate having a thickness of 200 µm or below, or 100 µm or below, or 50 µm or below, for example about 25 µm, a wrinkle-free substrate processing and/or substrate winding is desired and challenging. Accordingly, the substrate spreading can be generated with a spreader roller and the spreading can be thermally supported without front surface contact. Additionally or alternatively, substrate spreading can be provided with thermal heating without front surface contact.

Typically, the position of the first roller for example a spreader roller, without substrate front surface contact can result in a free-span length between the first roller and the processing drum, that is too long for an effective spreader effect. According to embodiments described herein, a heating device can "transport" that spreader effect of as spreader roller to the processing drum. Thereby, the spread substrate is heated in a manner such that it does not shrink to its initial length on the path to the processing drum, e.g. a coating drum. For example, the coating drum can also be heated. Additionally or alternatively, the heating device can generate the spread of the substrate or can assist the previously generated spread of the substrate. Accordingly, the heating unit can provide spreading without or in addition to a spreader roller.

According to some embodiments, which can be combined with other embodiments described herein, the heating device 130 can be positioned opposing the front side off the flexible substrate, particularly as the heating device does not require direct contact with the flexible substrate.

According to yet further embodiments, which can be combined with other embodiments described herein, an electrical heating device can also be provided in the first roller, for example a spreader roller. Thereby, within the roller device, a further electrical heating device is provided. The further electrical heating device may be adapted to be operated in a vacuum, such as a vacuum deposition chamber. In some embodiments, the further heating device, especially both ends of the further heating device, may be held by one holding device associated with the roller to be heated. For instance, the further heating device may be held by one holding device extending along the length of the further heating device in the roller device. In one example, the holding device, which provides the holding function for the first and the second end of the heating device, may provide a support of the heating device in the vacuum chamber or in the roller device. According to some embodiments described herein, the heating device is adapted to provide the outer surface of the heating device substantially at the same electrical potential as the roller device during vacuum deposition.

Figure 2A:
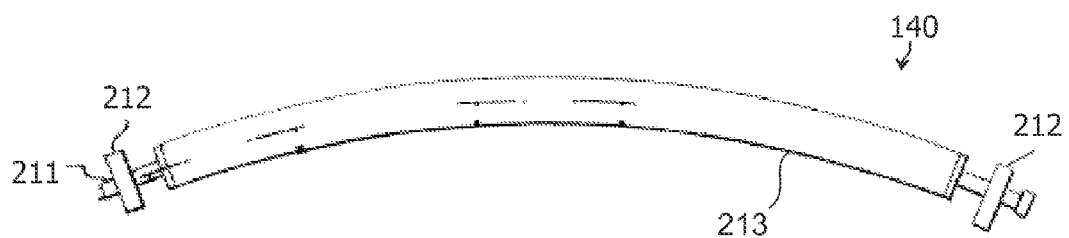
FIGS. 2A and 2B show schematic views of a spreader roller device used according to embodiments described herein.

An exemplary embodiment of a spreader roller 140 is shown in FIG. 2A. The spreader roller 140 can also be referred to as an expander roll, which can for example be used to spread a flexible substrate or eliminate wrinkles in a flexible substrate. The spreader roller 140 includes a bowed or curved center shaft 211. The opposing sides of the center shaft can be supported by mounting supports 212. The curved roll 213 is provided on the center shaft 211. The curved roll 213 can be provided by a flexible surface sheath, for example, made of rubber or the like. The curved roll affects transverse expansion of the flexible substrate when the roll is disposed with the convex side facing away from the flexible substrate.

Figure 2B:
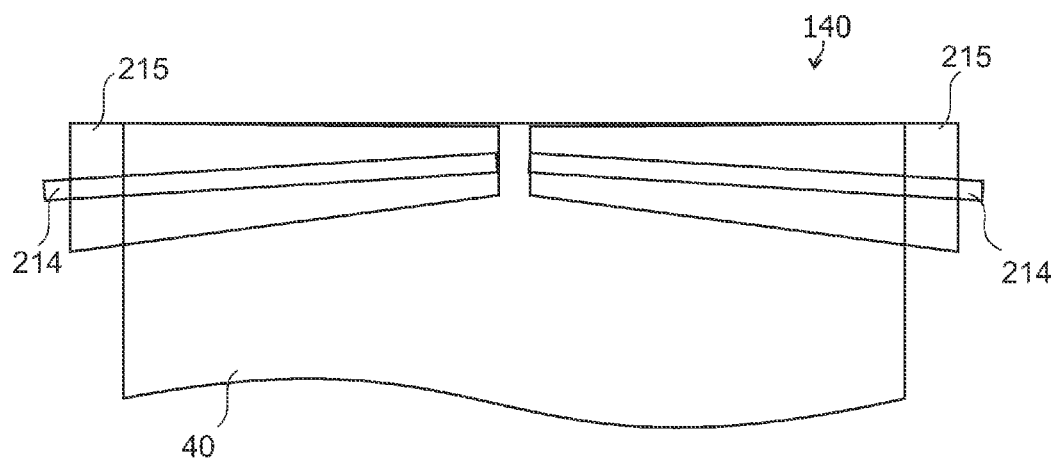

Another example of a spreader roller 140 is shown in FIG. 2B. The spreader roller includes two rotating elements 215, which rotate around respective axes 214. The two axes are inclined with respect to each other. The rotating elements have the form of a truncated cone, wherein the inner diameter is smaller than the outer diameter. The upper side of the rotating elements in FIG. 2B, which is contacted by the flexible substrate 40, is arranged such that the two rotating elements are aligned essentially along a straight line. However, in a cross-sectional view in a direction perpendicular to the cross-sectional view shown in FIG. 2B, the flexible substrate 40 contacts the rotating elements 215 only at the outer portions of the flexible substrate. Thereby, the spreading of the substrate can be achieved. The spreading can be increased by increasing the enlacement angle of the substrate around the spreader roller 140.

Figure 3A:
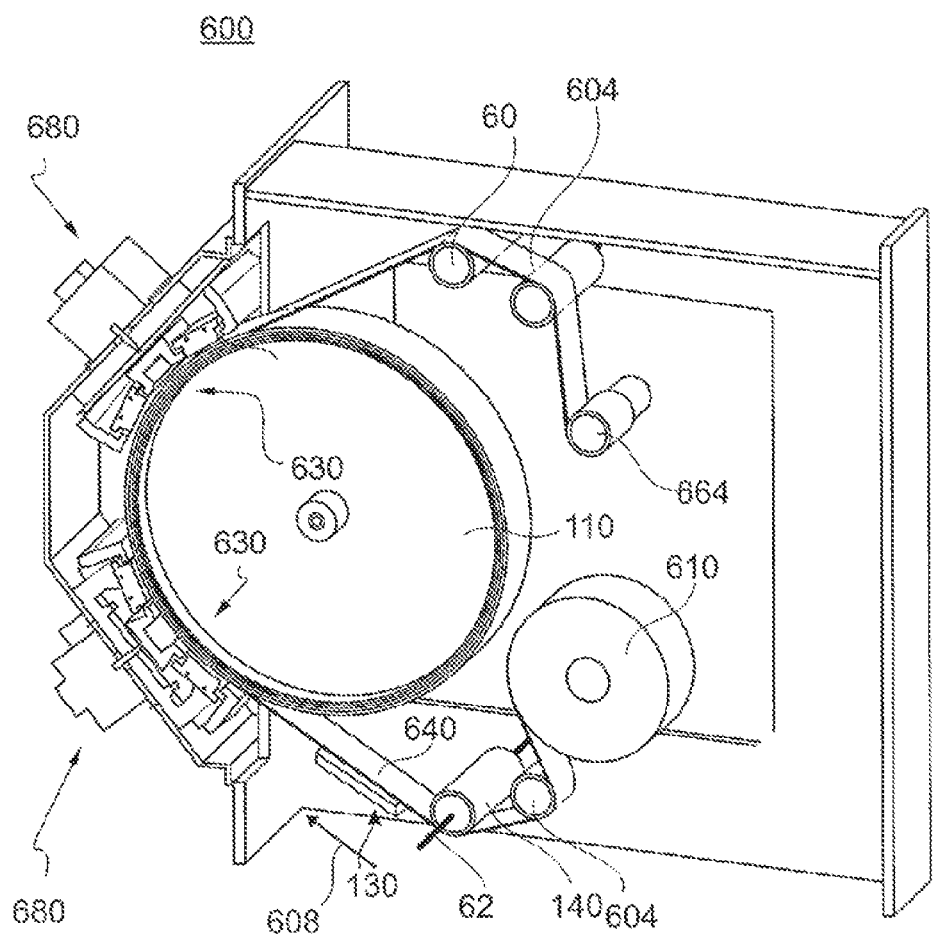
FIG. 3A shows a schematic view of a deposition apparatus according to embodiments described herein.

In one aspect, the use of a deposition apparatus according to embodiments is described, especially the use of a processing apparatus according to embodiments described herein is described with respect to FIG. 3A. FIG. 3A shows an example of a processing apparatus 600, such as a coating apparatus. Not limited to this embodiment, the processing apparatus may generally be configured to house a substrate (or web) storage spool, as it is illustrated in the embodiment of FIG. 3A and denoted by reference number 610. The web 640 is unwound from the storage spool 610, e.g. an unwinding spool, as indicated by the substrate movement direction shown by arrow 608.

The web 640 is guided via rollers 604 and, on one or more sides of the coating unit, via one web guide unit 60. According to embodiments, two or more rollers 604, and/or one, two, or more web guide units 60 being, for instance, a spreader roller 140, can be provided.

According to some embodiments, the web guide unit 60 may be a roller device as described above. In the embodiment shown in FIG. 3A, a heating device 130 is located between the spreader roller 140 and the processing drum 110. The heating device 130 reduces a de-spreading of the flexible substrate after the spreader roller 140 or may even increase the spread of the flexible substrate.

In some embodiments, operational parameters may be influenced for obtaining an optimization of the heating effect of the heating device 130. For instance, the velocity of the substrate may be influenced to achieve a longer or shorter impact of the heat provided by the heating device, depending on the spread of the substrate. Additionally to the heating device as described herein, a radiation heater or e-beam heater may be used for holding the temperature of the substrate after the substrate leaves the roller device.

After uncoiling from the web storage spool 610 and running over the roller 604 and the spreader roller 140, the web 640 is then moved through the processing areas 630 provided at the processing drum 110 and corresponding to positions of, e.g., the deposition sources 680. During operation, the processing drum 110 rotates around the axis such that the web moves in the direction of arrow 608.

After processing, the web may run over one or more further web guide units 60 (in the embodiment of FIG. 3A, it runs over one web guide unit). In addition, it may run over further rolls, such as rollers 604 depicted in FIG. 3A. As the processing of the flexible substrate, e.g. the web coating in the embodiment of FIG. 3A, is accomplished, the web is wound up on a spool 664. The web 640 may be coated with one or more thin films, i.e. one or more layers are deposited on the web 640 by deposition sources 680. The deposition takes place while the substrate is guided on the processing drum 110. A gas flow of processing gas can be provided from the outer portions of that deposition source 680 to the inner portion of that deposition source.

Embodiments described herein may refer inter alia to a plasma deposition system for depositing, from a plasma phase, thin films onto a moving substrate. The web may move in a substrate transport direction in a vacuum chamber where a plasma deposition source for transferring a deposition gas into a plasma phase and for depositing, from the plasma phase, a thin film onto the moving substrate is located.

As shown in FIG. 3A, and in accordance with embodiments described herein, a plasma deposition source 680 can be provided as a PECVD (plasma-enhanced chemical vapor deposition) source having a multi-region electrode device including two, three or even more RF (radio frequency) electrodes arranged opposite to a moving web. According to embodiments, multi region plasma deposition sources can also be provided for MF (middle frequency) deposition. According to yet further embodiments, which can be combined with other embodiments described hereon, one or more deposition sources, which are provided in the a deposition apparatus as described herein, can be a microwave source and/or can be a sputter source, e.g. a sputter target, particularly a rotary sputter target. For example, for a microwave source, a plasma is excited and maintained plasma by microwave radiation and the source is configured to excite and/or maintain the plasma with microwave radiation.

According to embodiments, the deposition apparatus may include more than one processing drum 110. It is possible to provide a heating device as described herein before each of the two or more processing drums. Additionally or alternatively, each processing drum may be provided with one, two, three, or even more deposition sources.

Figure 3B:
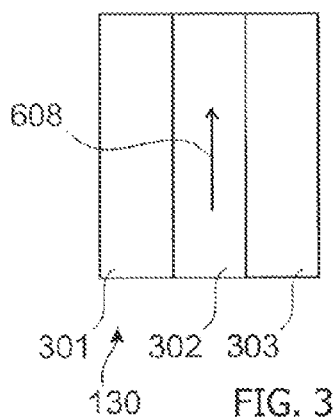
FIG. 3B shows a schematic view of a heating device according to embodiments described herein.

FIG. 3B illustrates an embodiment of a heating device 130. The arrow 608 shown in FIG. 3B indicates the direction along which the flexible substrate moves over the heating device. According to embodiments described herein, the heating device 130 is a radiation-heating device. Thereby, the heating device can be located facing the front surface of the flexible substrate and heat can be transferred to the substrate, i.e. the substrate can be heated without contacting the front surface. The heating device has a dimension in a direction parallel to a substrate transport direction of at least 20 mm, for example 30 mm or longer, e.g. in direction of arrow 608.

According to yet further embodiments, which can be combined with other embodiments described herein, the heating device 130 can have a length along the direction of arrow 608 of at least 5 cm, typically of at least 10 cm, such as 20 cm to 80 cm. The width of the heating device can typically be at least the 50% of the width of the substrate or at least 50% of the width of the processing drum 110, i.e. the dimension in direction of the rotation axis thereof. Yet, according to an example, the width can be for example more than the width of the flexible substrate and/or the processing drum, respectively, e.g. about 110% of the width of the flexible substrate. A larger width can, e.g. be applied for those cases where the heating devices have two or more segments, e.g. three segments 301, 302, and 303 as shown in FIG. 3B. A segmented heating device 130 can, however, be provided irrespective of the width of the heating device relative to the substrate width.

For example, two or more segments of the heating device 130 can be provided such that each segment can be individually controlled. That is, each segment can be heated to a different temperature and/or the heat radiation emitted by each of the segments can be different. Particularly for embodiments having a heating device 130 with a center segment and one or more outer segments, the heat radiation or heating of the center segment can be independently controlled from one or more outer segments. Thereby, for example, the substrate can be heated more in the center of the substrate in order to transport the substrate spread from the first roller of the roller arrangement, i.e. a roller adjacent to the processing drum 110, to the processing drum or generate a substrate spread by the increased temperature at the center portion thereof.

Figure 4:
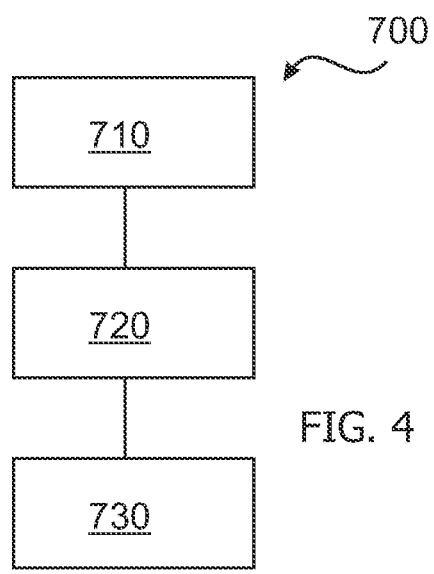
FIG. 4 shows a flow chart of a method for heating a substrate according to embodiments described herein.

According to some embodiments, a method for spreading a substrate in a vacuum deposition apparatus is described. The vacuum processing apparatus may be a deposition apparatus as described herein and having a heating device configured for spreading the substrate in the first direction or for maintaining a spread of the substrate in the first direction. FIG. 4 shows a flow chart 700 of a method according to embodiments described herein. The method includes in box 710 guiding a substrate in a vacuum chamber using a roller device.

As described above, the substrate may be a flexible substrate such as a web, a foil, a thin material volume or the like. In one embodiment, the substrate may include plastic material, PET, PE, PU, metal, paper or the like.

In box 720 of the flow chart 700, the substrate is spread in a direction essentially orthogonal to the transport direction, i.e. is laterally spread. This can, for example, be conducted by a spreader roller or by a heating device located adjacent to the processing drum.

In box 730, unless the substrate spread is provided by merely a heating device in step 720, the introduced substrate spread can be transported from the spreader roller to the processing drum.

According to embodiments described herein, a power density of at least 5 kW/m$^2$ el. Power of the heating device, i.e. electrical power provided to the heating device or above can be provided by the heating device to maintain a substrate spread, reduce shrinkage or even to spread the substrate laterally.

FIG. 5 shows another apparatus for processing a flexible substrate, e.g. for depositing a thin film on the flexible substrate. Thereby, as exemplarily shown in FIG. 5, the apparatus 100 includes a vacuum chamber 102. The vacuum chamber has a first chamber portion 102A, a second chamber portion 102B and a third chamber portion 102C. The first chamber portion 102A is configured as a winding/unwinding chamber and can be separated from the remaining portions of the chamber for exchange of the flexible substrate such that the remaining chamber portions 102B/C do not need to be vented for removing the processes flexible substrate and evacuated after the new substrate has been inserted. Thereby, the downtime of the apparatus can be reduced. Accordingly, the overall objective of increased throughput can be served. FIG. 5 particularly illustrates as an optional modification of other embodiments described herein that the first chamber portion 102A is separated in an interleaf chamber portion unit 102A1 and a substrate chamber portion unit 102A2 of the first chamber portion. Thereby the interleaf rolls 766/766' and the interleaf rollers 105 can be provided as a modular element of an apparatus. That is the apparatus with the chamber portion unit 102A2 can be provided, operated and manufactured to have an apparatus in the event no interleaf is wished. If an operator wants to have the option to use an interleaf, he can add the interleaf chamber portion unit 102A1, e.g. as an upgrade of the machine or the like, and can use the interleaf as desired. Accordingly, the CoO can be easily and flexibly adapted to the needs of the owner of the apparatus. Further, one interleaf chamber portion unit 102A1 could be used for two or more apparatuses having the chamber elements 102A2, 102B and 102C. Thereby, the chamber portion units 102A1 and 102A2 can be configured to define one vacuum region of the vacuum chamber 102 if both units are present as indicated by the dashed line in FIG. 4B or the chamber portion unit 102A2 alone can define the respective vacuum region if the interleaf module is not present.

The substrate is provided on a first roll 764 having a shaft, which is e.g. used for unwinding in FIG. 5. The substrate is wound on a second roll 764' having a shaft, which is e.g. used for winding in FIG. 5. However, it is understood that the substrate can also be guided through the apparatus 100 in the reverse direction such that the shafts can be used for winding instead of unwinding and for unwinding instead of winding. Accordingly, the unwinding shaft for supporting the flexible substrate to be processed and the winding shaft supporting the flexible substrate having the processed thin film thereon are provided in the first chamber portion 102A. The flexible substrate 106 is provided on a first roll 764, e.g. having a winding shaft. According to some embodiments, which can be combined with other embodiments described herein, the flexible substrate to be processed can be provided on the roll 764 together with an interleaf 706. Thereby, the interleaf can be provided between adjacent layers of the flexible substrate such that direct contact of one layer of the flexible substrate with an adjacent layer of the flexible substrate on roll 764 can be omitted. According to typical embodiments, the substrate is guided via one, two or more rollers 104 from the roll 764 to the coating drum and from the coating drum to the second roll 764', e.g. having a winding shaft, on which the substrate is wound after processing thereof. After processing, a further interleaf can be provided from interleaf roll 766' between the layers of the flexible substrate 106, which is wound on to the roll 764'.

Figure 6:
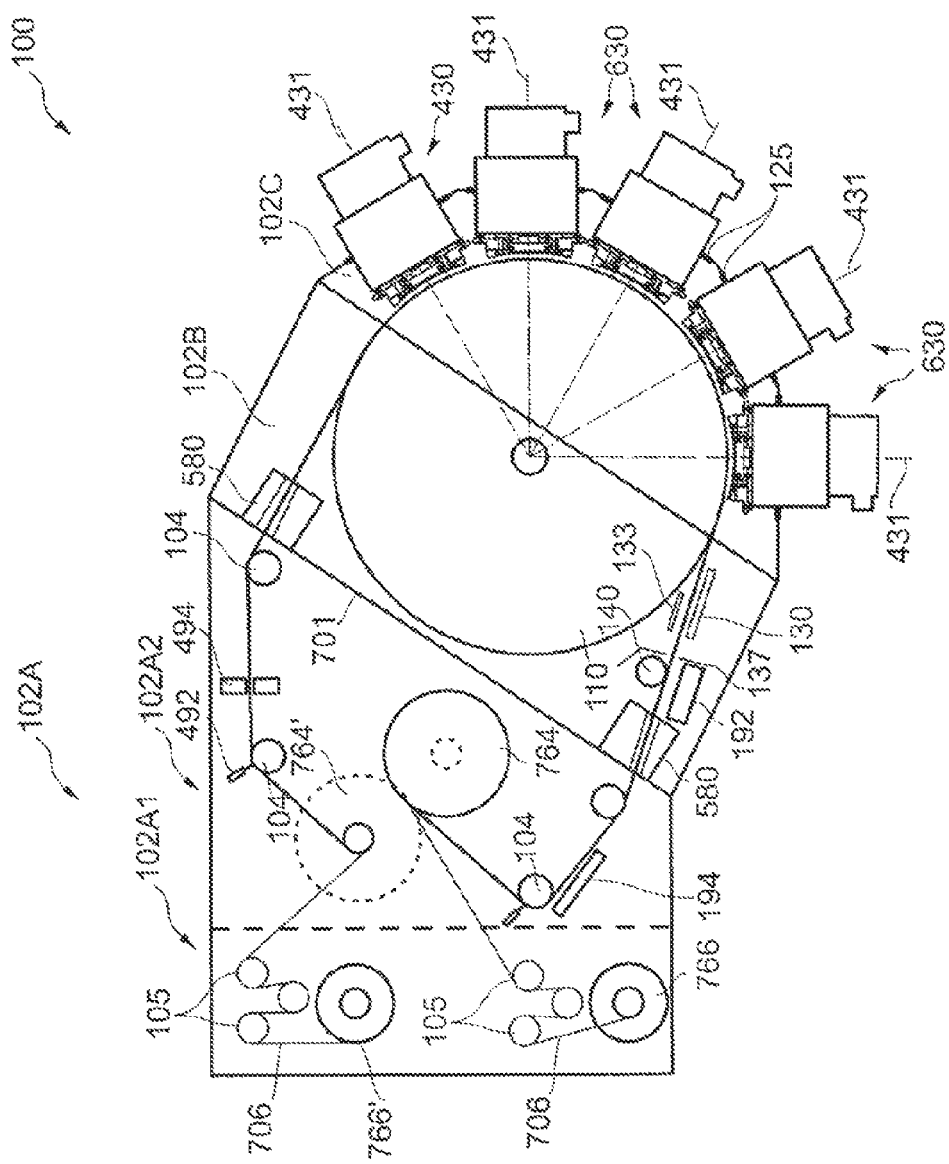
FIG. 6 shows a schematic view of a deposition apparatus according to embodiments described herein.

According to the embodiments described herein, at least one gap sluice 540 for separating the first chamber portion from the second chamber portion is provided at a separation wall 701. As shown in FIG. 5 typically two gap sluices are provided. As shown in FIG. 6, a gap sluice 580 can also be provided irrespective of a roller changing the direction of the substrate. The one or more gap sluices are configured such that the flexible substrate can move there through and the gap sluice can be opened and closed for providing a vacuum seal. According to typical embodiments, a gap sluice may include a roller for guiding the substrate, e.g. for redirecting the substrate movement by an angle of 10° or above. Further, an inflatable seal is provided that can be pressed against the roller of the gap sluice. The gap sluice is closed by inflating the seal and the first chamber portion 102A and the second chamber portion 102B are separated from each other in a vacuum tight manner. Thus, the first chamber portion 102A can be vented while the second chamber portion 102B can be maintained under technical vacuum.

According to a further alternative implementation, the gap sluice can also be provided without a roller. An inflatable seal can press the substrate against a flat sealing surface. Yet, also other means for selectively opening and closing the gap sluice can be utilized wherein opening and closing, i.e. having an open substrate path and a vacuum seal, can be conducted while the substrate is inserted. Having the gap sluice for closing the vacuum seal while the substrate is inserted allows for particularly easy exchange of the substrate, as the substrate from the new roll can be attached to the substrate from the previous roll and the flexible substrate can be wound through the system while chamber portions 102B and 102C are evacuated by pulling the previous substrate with the new substrate attached thereto through the apparatus.

As further shown in FIG. 5, a coating drum or a processing drum 110 having a rotation axis is provided in the apparatus. The processing drum has a curved outer surface for guiding the substrate along the curved outer surface. The substrate is thereby guided through a first vacuum processing region, e.g. of the lower processing station 630 in FIG. 5, and at least one second vacuum processing region, e.g. further processing stations 630/430 in FIG. 5. Even though it is often referred to herein to deposition stations being the processing stations 630, also other processing stations, like etch stations, heating stations, etc. can be provided along the curved surface of the processing drum 110. Accordingly, the apparatuses described herein, and having compartments for various deposition sources allow for a modular combination of several CVD, PECVD and/or PVD processes in a single deposition apparatus, e.g. a R2R coater. The modular concept, wherein all kinds of deposition sources including those which require very good gas separation, can be used in a deposition apparatus according to embodiments described herein, helps to bring down costs for the deposition of complex layer stacks that have to be deposited applying different deposition technologies or intricate combinations of process parameters.

Generally, according to different embodiments, which can be combined with other embodiments described herein, the plasma deposition source can be adapted for depositing a thin film on a flexible substrate, e.g., a web or a foil, a glass substrate or silicon substrate. Typically, the plasma deposition source can be adapted for and can be used for depositing a thin film on a flexible substrate, e.g., to form a flexible TFT, a touch screen device component, or a flexible PV module.

According to embodiments described herein, a first portion of the coating drum, i.e. an area of the cross-section of the coating drum perpendicular to the rotation axis, is provided in the second chamber portion 102B and the remaining portion of the coating drum, i.e. an area of the cross-section of the coating drum perpendicular to the rotation axis, is provided in the third chamber portion 102C.

As described above, FIG. 5 shows a deposition apparatus 100. The deposition apparatus 100 includes a chamber 102, which can typically be provided such that the vacuum can be generated in the chamber. Thereby, various vacuum processing techniques, and particularly vacuum deposition techniques, can be used to process the substrate or to deposit the thin-film on the substrate. As shown in FIG. 5, and as referred to herein, the apparatus 100 is a roll-to-roll deposition apparatus, bearing a flexible substrate 106 being guided and processed. The flexible substrate 106 is guided in FIG. 5, as indicated by arrow 108, from the chamber portion 102A to the chamber portion 102B and further to the chamber portion 102C having the processing stations therein. The flexible substrate is directed by the rollers 104 to a processing drum 110 configured for supporting the substrate during processing and/or deposition. From the processing drum 110, the substrate 106 is guided to a further roller 104 and into chamber portions 102B and 102A, respectively.

According to yet further embodiments, which can be combined with other embodiments described herein, the apparatus 100 can further include a pre-heating unit 194 to heat the flexible substrate. Thereby, a radiation heater, an e-beam heater or any other element to heat the substrate prior to processing thereof can be provided. Further, additionally or alternatively a pre-treatment plasma source 192, e.g. an RF plasma source or ion source can be provided to treat the substrate with a plasma prior to entering the third chamber portion 102C. For example, the pre-treatment with a plasma can provide for a surface modification of the substrate surface to enhance film adhesion of a film deposited thereon or can improve the substrate morphology in another manner to improve processing thereof.

As shown in FIG. 5 a heating device 130 is provided according to some embodiments described herein, which can spread the substrate, i.e. provide a lateral stretch of the substrate without front surface contact and by providing heat to the flexible substrate. Thereby, any of the heating devices configured for spreading the substrate in a lateral direction or for maintaining a spread of the substrate in a lateral direction, which are described herein, can be utilized for embodiments described with respect to FIG. 5. As shown in FIG. 5, according to some further embodiments, a heat adjustment unit 133 positioned opposing a first side of the heating device 130 can be provided. The heat adjustment unit and the heating device form a gap or a tunnel forming a path for the flexible substrate. For example, wherein the heat adjustment unit can be a further heating device, a heat reflector plate, or a combination thereof. The tunnel can have a dimension in a direction parallel to a substrate transport direction of at least 20 mm, for example 30 mm or longer.

FIG. 5 illustrates a processing apparatus 100, wherein the wall 701 and/or the axis defined by the distance between the gap sluices 540, which are capable of providing a vacuum separation between the first chamber portion 102A and the second chamber portion 102B, are inclined with respect to a vertical or horizontal orientation. Typically, the angle of inclination can be 20° to 70° relative to the vertical. Thereby, the inclination is such that the processing drum is displaced downwardly as compare to a horizontal arrangement of the similar components without inclination. The inclination of the wall and/or the axis defined between the gap sluices allows for providing additional processing stations or deposition sources 630 to be provided such that its axis (see lines 431 shown in FIG. 5), e.g. the symmetry axis of the plasma electrode is on the same height or below the axis of the processing drum 110. As shown in FIG. 5, four deposition sources 630 are provided at the height of the rotation axis of the processing drum or below. As described above, flaking and falling of generated particles on the substrate can thereby be reduced or omitted. The fifth processing station, which is shown as an etching station 430 in FIG. 5 can, for example, be provided above the rotation axis of the processing drum 110. However, it will be understood that an etching station 430 can also be provided at any of the other positions of the convex wall portion of the chamber portion 102C.

According to yet further embodiments, which can be combined with other embodiments described herein, optionally also an optical measurement unit 494 for evaluating the result of the substrate processing and/or one or more ionization units 492 for adapting the charge on the substrate can be provided.

FIG. 6 illustrates a further processing apparatus 100 according to embodiments described herein. Thereby, features, details, aspects, and implementation, which have already been described with respect to FIG. 5, will not be described again. However, it is to be understood, that such features, details, aspects and implementations, as well as further details of other embodiments described herein, can also be implemented into the processing apparatus 100 shown in FIG. 6. As shown in FIG. 6, according to some embodiments, a spreader roller 140 can be provided as the roller being closest to the processing drum 110. The spreader roller 140 spreads the substrate, i.e. stretches the substrate laterally, that is in a direction essentially parallel to the rotation axis of the processing drum 110. In order to reduce shrinkage of the lateral spread introduced by the spreader roller, maintain the spread introduced by the spreader roller, or even increase the spread introduced by the spreader roller, the heating device 130 is provided in the direction of the substrate path between the spreader roller 140 and processing drum.

Further, a heat adjustment unit 133 is provided. Thereby, the heated adjustment unit and the heating device form a gap or a tunnel, such that the substrate can pass therethrough. According to some embodiments, which can be combined with other embodiments described herein, the cooling unit 137 is provided between the heating device 130 and the spreader roller 140. The cooling unit may also be provided if the first roller, that is the first roller upstream or downstream of the processing drum 110 is not the spreader roller. The cooling unit 137 is configured to protect the spreader roller 140 from heat radiation generated by the heating device 130. Thereby, the cooling unit can passively cool the spreader roller 140, e.g. by providing a shield for the heat radiation. Alternatively, the cooling unit can be an actively cooled cooling unit.

While the foregoing is directed to embodiments of the invention, other and further embodiments of the invention may be devised without departing from the basic scope thereof, and the scope thereof is determined by the claims that follow.

The invention claimed is:

1. A processing apparatus for processing a flexible substrate, comprising:
    a vacuum chamber;
    a processing drum within the vacuum chamber, wherein the processing drum is configured to rotate around an axis extending in a first direction;
    a deposition or etch station adjacent the processing drum;
    a heating device adjacent to the processing drum, wherein the heating device is configured for spreading the substrate in the first direction or for maintaining a spread of the substrate in the first direction, and wherein the heating device has a dimension in a direction parallel to a substrate transport direction of at least 20 mm; and
    a substrate transport arrangement including one or more rollers, wherein the heating device is positioned between the processing drum and a roller of the one or more rollers, wherein the roller is a first roller to touch the substrate upstream or downstream of the processing drum.

2. The processing apparatus according to claim 1, wherein the substrate transport arrangement guides the flexible substrate from an un-winding roller to a re-winding roller.

3. The processing apparatus according to claim 2, wherein the substrate transport arrangement includes a spreader roller.

4. The processing apparatus according to claim 1, wherein the substrate transport arrangement includes a spreader roller.

5. The processing apparatus according to claim 4, wherein the first roller is the spreader roller.

6. The processing apparatus according to claim 1, further comprising:
    a heat adjustment unit, wherein the heat adjustment unit is positioned opposing a first side of the heating device, and wherein the heat adjustment unit and the heating device form a gap or a tunnel providing a path for the flexible substrate.

7. The processing apparatus according to claim 6, wherein the heat adjustment unit is a further heating device, a heat reflector plate, or a combination thereof.

8. The processing apparatus according to claim 1, wherein the heating device is at least one of an infrared heating device and an inductive heating device.

9. The processing apparatus according to claim 1, wherein contact between the substrate transport arrangement and a backside of the substrate occurs only in the vacuum chamber.

10. The processing apparatus according to claim 1, further comprising:
    a cooling unit provided between the heating device and the first roller, wherein the cooling unit is configured to protect the first roller from heat radiation generated by the heating device.

11. The processing apparatus according to claim 1, wherein a distance from the heating device to the processing drum is 20 cm or below.

12. The processing apparatus according to claim 1, wherein a distance from the heating device to the processing drum is 10 cm or below.

13. The processing apparatus according to claim 1, wherein a distance along a transport path of the flexible substrate from the first roller to the processing drum is 100 cm or below.

14. The processing apparatus according to claim 1, wherein a distance along a transport path of the flexible substrate from the roller to the processing drum is 50 cm or below.

15. The processing apparatus for processing a flexible substrate of claim 1, wherein the substrate transport arrangement guides the flexible substrate from a un-winding roller to a re-winding roller, wherein the first roller to touch the substrate is a spread roller.

16. The processing apparatus according to claim 15, further comprising:
    a heat adjustment unit, wherein the heat adjustment unit is positioned opposing a first side of the heating device, and wherein the heat adjustment unit and the heating device form a gap or a tunnel providing a path for the flexible substrate.

* * * * *